United States Patent [19]
Ball et al.

[11] Patent Number: 5,315,611
[45] Date of Patent: May 24, 1994

[54] HIGH AVERAGE POWER MAGNETIC MODULATOR FOR METAL VAPOR LASERS

[75] Inventors: Don G. Ball, Livermore; Daniel L. Birx, Oakley; Edward G. Cook; John L. Miller, both of Livermore, all of Calif.

[73] Assignee: The United States of America as represented by the United States Department of Energy, Washington, D.C.

[21] Appl. No.: 898,105

[22] Filed: Jun. 12, 1992

Related U.S. Application Data

[63] Continuation-in-part of Ser. No. 915,197, Sep. 29, 1986, Pat. No. 5,189,628, and a continuation-in-part of Ser. No. 336,451, Mar. 15, 1989, Pat. No. 5,177,754, which is a continuation of Ser. No. 915,163, Sep. 25, 1986, abandoned.

[51] Int. Cl.$^5$ ............................................. H01S 3/22
[52] U.S. Cl. ......................................... 372/56; 372/38; 372/69; 359/333
[58] Field of Search .................... 372/38, 37, 56, 69, 372/25, 30; 307/261, 268; 359/333

[56] References Cited

U.S. PATENT DOCUMENTS

| | | | |
|---|---|---|---|
| 3,573,508 | 4/1971 | Harris | 307/284 |
| 3,646,395 | 2/1972 | De Pratti | 315/242 P |
| 3,781,690 | 12/1973 | Corson | 328/67 |
| 4,075,537 | 2/1978 | Quillfeldt | 315/354 |
| 4,207,540 | 6/1980 | Ernst | 331/94.5 PE |
| 4,245,194 | 1/1981 | Fahlen et al. | 331/94.5 D |
| 4,275,317 | 6/1981 | Laudenslager et al. | 307/415 |
| 4,288,758 | 9/1981 | Seguin et al. | 331/94.5 |
| 4,398,156 | 8/1983 | Aaland | 328/233 |
| 4,494,236 | 1/1985 | Sutter, Jr. | 372/25 |
| 4,674,022 | 6/1987 | Ver Planck | 363/57 |
| 4,677,636 | 6/1987 | Laudenslager et al. | 372/68 |
| 4,687,918 | 8/1987 | Hughes et al. | 250/205 |
| 4,698,518 | 10/1987 | Pacala | 307/106 |
| 4,779,022 | 10/1988 | Badenhoop et al. | 313/35 |
| 4,954,792 | 9/1990 | Patron | 331/169 |
| 4,975,924 | 12/1990 | Iwata et al. | 372/56 |
| 5,072,191 | 12/1991 | Nakajima et al. | 372/38 |
| 5,140,602 | 8/1992 | O'Loughlin | 372/37 |

OTHER PUBLICATIONS

"The Use of Saturable Reactors As Discharge Devices For Pulse Generators," W. S. Melville, B.Sc.(Eng)., Associate Member, Paper No. 1034, Radio Section, Cambridge Radio Group (Sep. 15, 1950).

"Basic Principles Covering The Design of Magnetic Switches", by D. L. Birx, E. J. Lauer, L. L. Reginato, J. Schmidt, M. Smith, Lawrence Livermore Laboratory UCID-11831, Nov. 18, 1980.

"The Application of Magnetic Pulse Compression To the Grid System of the ETA/ATA Accelerator," D. L. Birx, E. G. Cook, L. L. Reginato, J. A. Schmidt, M. W. Smith, Lawrence Livermore National Laboratory, Livermore, Calif. 94550, IEEE Fifteenth Power Modulator Symposium, Jun. 14–16, 1982.

"High-Power Pulse Generation Using Semiconductors and Magnetic Cores," Edward M. Lassiter, Paul R. Johannessen, Richard H. Spencer, AIEE Paper No. 60–870 (Jun. 19, 1960).

"Transformers," James P. O'Loughlin, Air Force Weapons Laboratory, Pulsed Power Lecture Series, Lecture No. 18, Plasma and Switching Laboratory, Department of Electrical Engineering, Texas Tech University, Lubbock, Tex. 79409, pp. 10, 12–13 (1979).

"Achieving Complete Turn-On In Large Area Thyristors," Sridhar R. Babu, Wilbur R. Comstock, Frank W. Kalkbrenner, Conference Record, Industry Applications Society, IEEE-IAS-1983 Annual meeting, Oct. 3, 1983, IEEE Catalog No. 83 CH1900-0.

"Development and Operation of a Solid-State Switch For Thyratron Replacement," B. T. Merritt and G. R. Dreifuerst, Jun. 14, 1991, UCRL-JC-105355, Preprint Eighth IEEE International Pulsed Power Conference.

*Primary Examiner*—Léon Scott, Jr.
*Attorney, Agent, or Firm*—Henry P. Sartorio; Roger S. Gaither; William R. Moser

[57] ABSTRACT

A three-stage magnetic modulator utilizing magnetic pulse compression designed to provide a 60 kV pulse to a copper vapor laser at a 4.5 kHz repetition rate is disclosed. This modulator operates at 34 kW input power. The circuit includes a step up auto transformer and utilizes a rod and plate stack construction technique to achieve a high packing factor.

23 Claims, 13 Drawing Sheets ically generated by a thyratron
HIGH AVERAGE POWER MAGNETIC MODULATOR FOR METAL VAPOR LASERS

STATEMENT AS TO RIGHTS OF INVENTION

The United States Government has rights in this invention pursuant to Contract No. W-7405-ENG-48 between the United States Department of Energy and the University of California for the operation of the Lawrence Livermore National Laboratory.

CROSS-REFERENCE TO RELATED APPLICATIONS

This application is a continuation-in-part of the patent application entitled "Coupling Apparatus for a Metal Vapor Laser," Ser. No. 06/915,197, filed Sep. 29, 1986 (IL-7317) now U.S. Pat. No. 5,189,628.

This application is also a continuation-in-part of the patent application entitled "Magnetic Compression Laser Driving Circuit," Ser. No. 07/336,451, filed Mar. 15, 1989 (IL-7425B, L&L No. 195/116) now U.S. Pat. No. 5,177,754, itself a file wrapper continuation of patent application Ser. No. 06/915,163, filed Sep. 25, 1986 (IL-7425A) (now abandoned).

Patent application Ser. Nos. 07/336,451 and 06/915,197 are both currently the subject of Notices of Allowability (Form D-10).

INCORPORATION BY REFERENCE

The entirety of patent application Ser. Nos. 07/336,451 and 06/915,197 are hereby incorporated herein by reference as if set forth fully herein.

BACKGROUND OF THE INVENTION

1. Field of the Invention

The present invention relates to a high average power magnetic modulator for metal vapor lasers.

2. Description of Related Art

Extensive experience with thyratron driven capacitor inversion circuits for driving moderate power copper lasers ($\approx 10$ kW input) leads to the conclusion that this type of circuit would not exhibit the lifetime required for the new higher power copper vapor lasers. The dI/dt, peak amplitudes, and repetition rates of existing modulators caused premature thyratron failure due to cathode depletion and anode erosion; a factor of three increase in power requirements would only increase the problem. An examination of other types of modulator switches, technologies, and circuit topologies has not revealed a simple, inexpensive, or proven alternative. It was determined that more complex magnetic compression circuits could reduce the electrical stress on the thyratron thereby potentially increasing lifetime; but their use, in turn, raised questions concerning jitter, long term reliability, efficiency, and component lifetimes.

Magnetic compression circuits are well-known in the art for having the capability of compressing a first series of voltage pulses, each having a first duration to form a second series of voltage pulses, each having a shorter second duration ("pulse width"). The first series of voltage pulses are typ circuit. The second series of voltage pulses can be used for application to a laser, such as a metal vapor laser, to affect generation of a corresponding series of laser beam pulses. Such pulsed lasers are utilized in many applications such as medical diagnostics, laser isotope separation of an atomic vapor (known as an AVLIS (Atomic Vapor Laser Isotope Separation) process), and many other applications. It is frequently desirable to increase the amplitude of the voltage of the pulses prior to application to the laser.

A magnetic compression circuit generally utilizes a multi-stage LC network to provide the compression. Such magnetic compression circuits usually include a switching means at the last stage comprising a single turn. The total energy being put through such a device determines the minimum amount of magnetic core material which is required for the application. Additional core material above this minimum amount reduces efficiency and leads to additional losses. Thus it is preferable to build a core having as close to the minimum required amount of core material as is possible. A multi-turn output switch is desirable in order to obtain a higher packing factor and reduce the overall volume of the device. However, traditional methods of shielding a multi-turn output switch (e.g., winding wire about a torroid) serve to unnecessarily increase the volume of magnetic material required, resulting in less electrical efficiency. In accordance with the present invention a multi-turn output switch is provided which permits a high packing factor without increasing the amount of core material required.

SUMMARY OF THE INVENTION

It is an object of the present invention to provide an improved magnetic modulator for metal vapor lasers.

The magnetic modulator of the present invention comprises a magnetic compression circuit and a transformer. The magnetic compression circuit comprises at least one stage of magnetic pulse compression apparatus for taking a series of electrical pulses in the microsecond pulse width range and inverting them to electrical pulses in the nanosecond pulse width range. The transformer increases the voltage amplitude of the electrical pulses so that the output voltage of the electrical pulses from the magnetic modulator is greater than the input voltage of the electrical pulses applied to the magnetic modulator.

The magnetic modulator of the present invention comprises a magnetic compression circuit and a transformer. The magnetic compression circuit comprises at least one stage of magnetic pulse compression apparatus for taking a series of electrical pulses in the microsecond pulse width range and inverting them to electrical pulses in the nanosecond pulse width range. The transformer increases the voltage amplitude of the electrical pulses so that the output voltage of the electrical pulses from the magnetic modulator is greater than the input voltage of the electrical pulses applied to the magnetic modulator.

The magnetic compression apparatus comprises multistage switches where the last stage has at least two turns (or windings). The circuit also comprises apparatus for applying the second series of pulses to a laser to effect generation of a series of laser pulses which corresponds to the second series of pulses in terms of repetition rate.

By utilizing switches which have at least two turns in the last stage of the magnetic compression laser driving circuit, the present invention is more compact than prior art circuits.

By utilizing a step-up transformer, portions of the magnetic modulator may operate at lower voltages and increased overall efficiency is possible.

Additional objects, advantages and novel features of the present invention will be set forth in part in the description which follows and in part become apparent to those skilled in the art upon examination of the following, or may be learned by practice of the invention. The objects and advantages and features of the present invention may be realized and attained by means of the instrumentalities and combinations particularly pointed out in the appended claims.

DESCRIPTION OF THE PREFERRED EMBODIMENTS

Detailed Description of the Drawings

Figure 1:
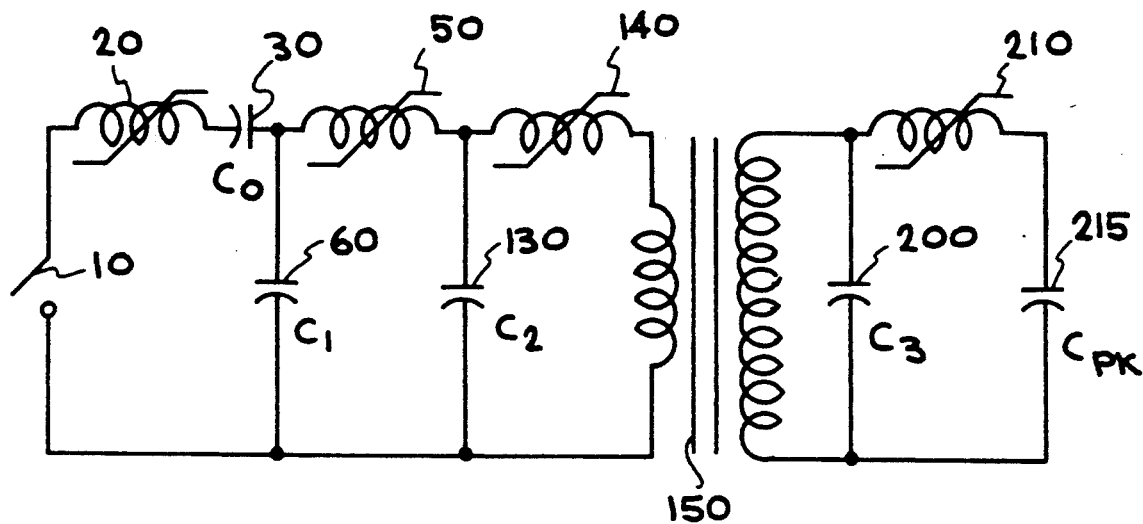
FIG. 1 depicts a simplified electrical schematic diagram of a three stage magnetic modulator circuit of the present invention.

FIG. 1 is an electrical schematic diagram of the three-stage magnetic compression circuit ("magnetic modulator"). Main switch 10, when closed, triggers the circuit. This is typically a thyratron or stack-type SCR (Silicon Controlled Rectifier) device or the like. The magnetic assist apparatus (20) operates as follows. Prior to main switch (10) closing, capacitor $C_0$ (30) is charged to the supply voltage. When main switch 10 is closed, current begins to flow through magnetic assist 20 and through main switch 10 to begin to charge capacitor $C_1$ (60) in the first stage magnetic compression circuit. In a preferred embodiment magnetic assist 20 comprises an inductor selected to delay this current flow for approximately 50 nS so that main switch 10 may become completely closed prior to full current flow.

Figure 3B:
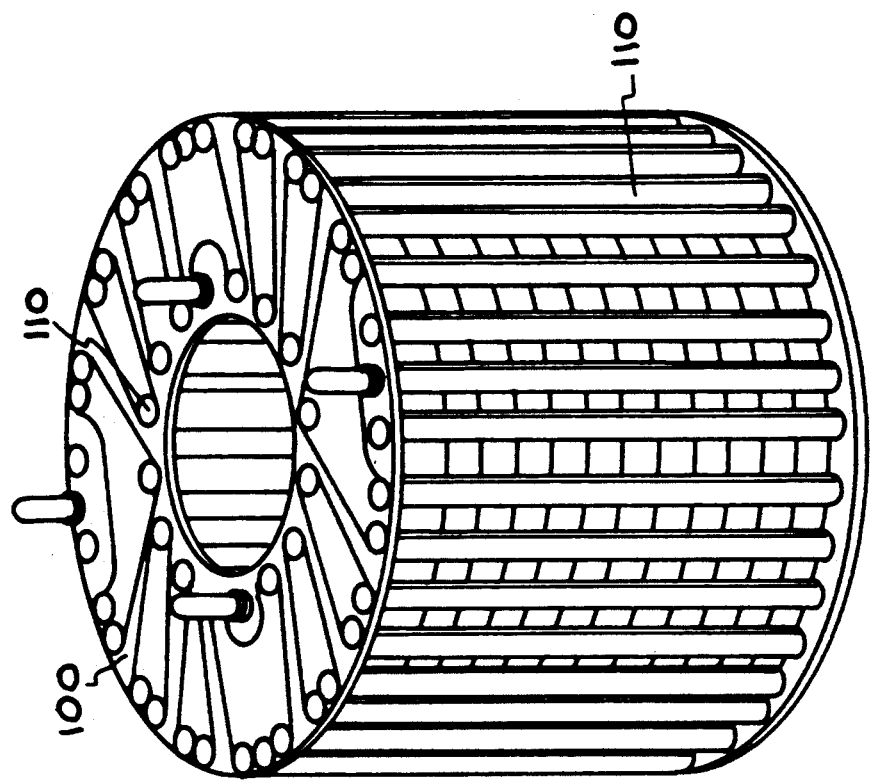
FIGS. 3A and 3B depict a first stage switch of the present invention.
Figure 3A:
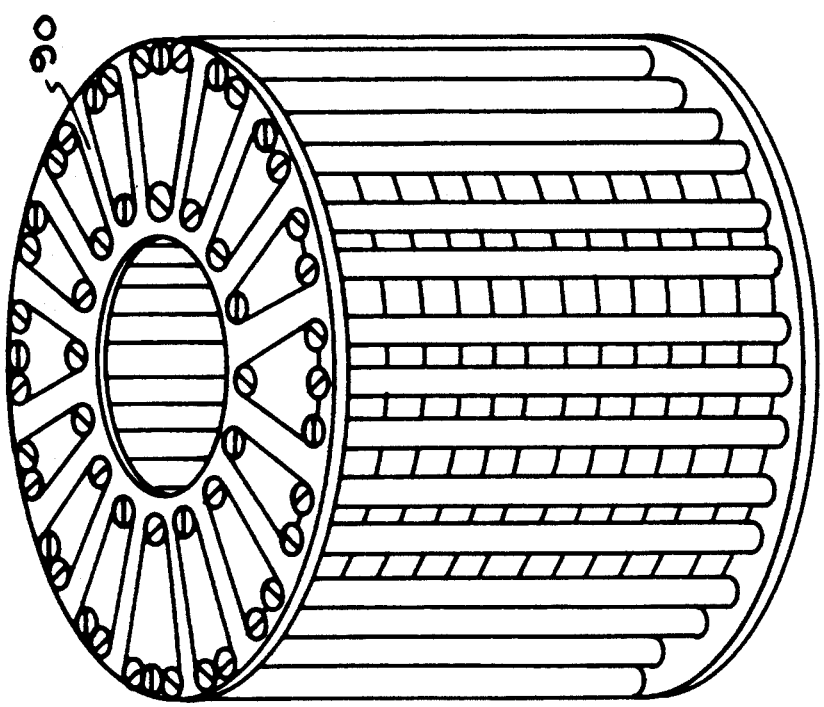
Figure 4:
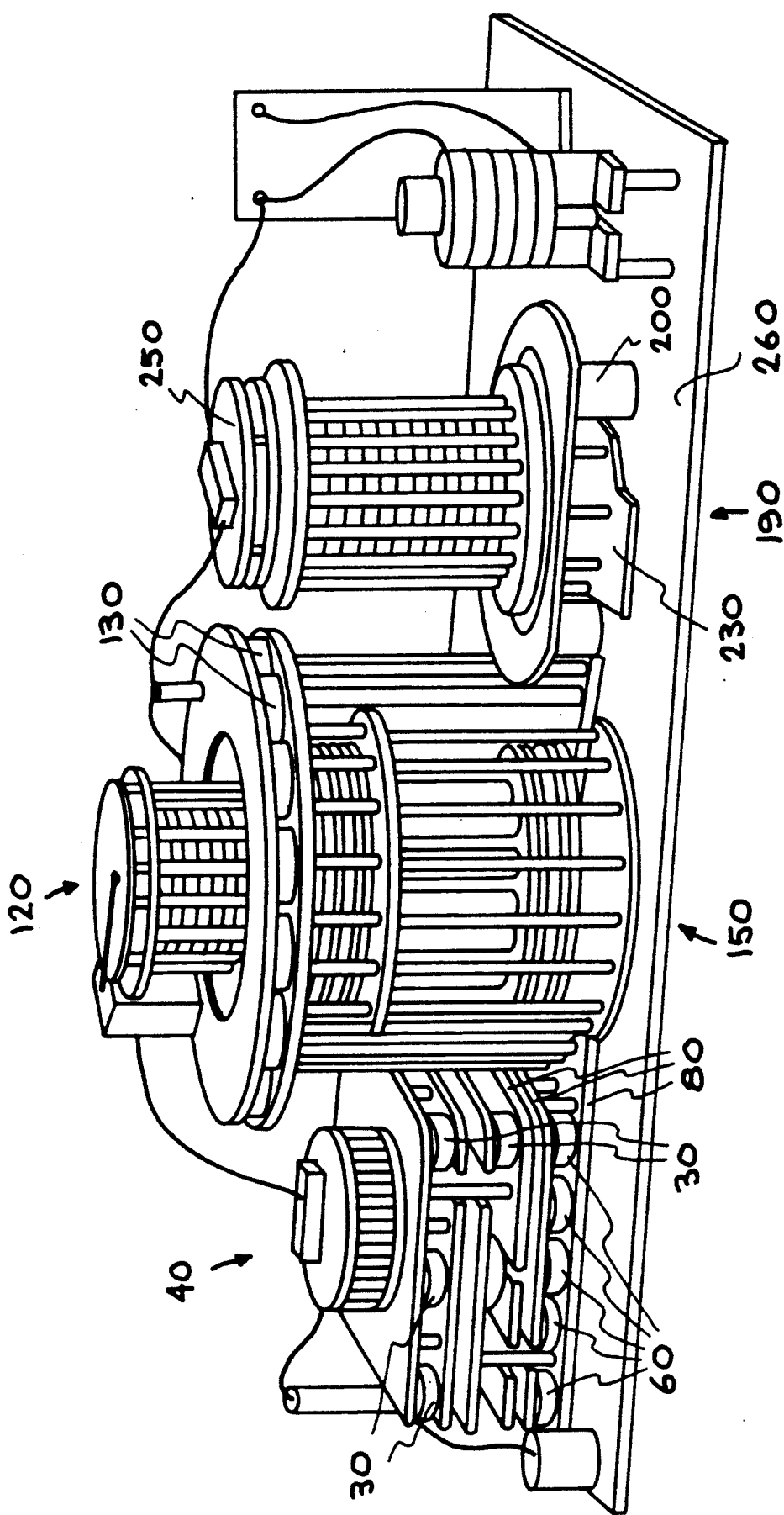
FIG. 4 depicts a magnetic modulator assembly comprising a first stage switch, second stage switch, transformer and third stage switch.
Figure 5A:
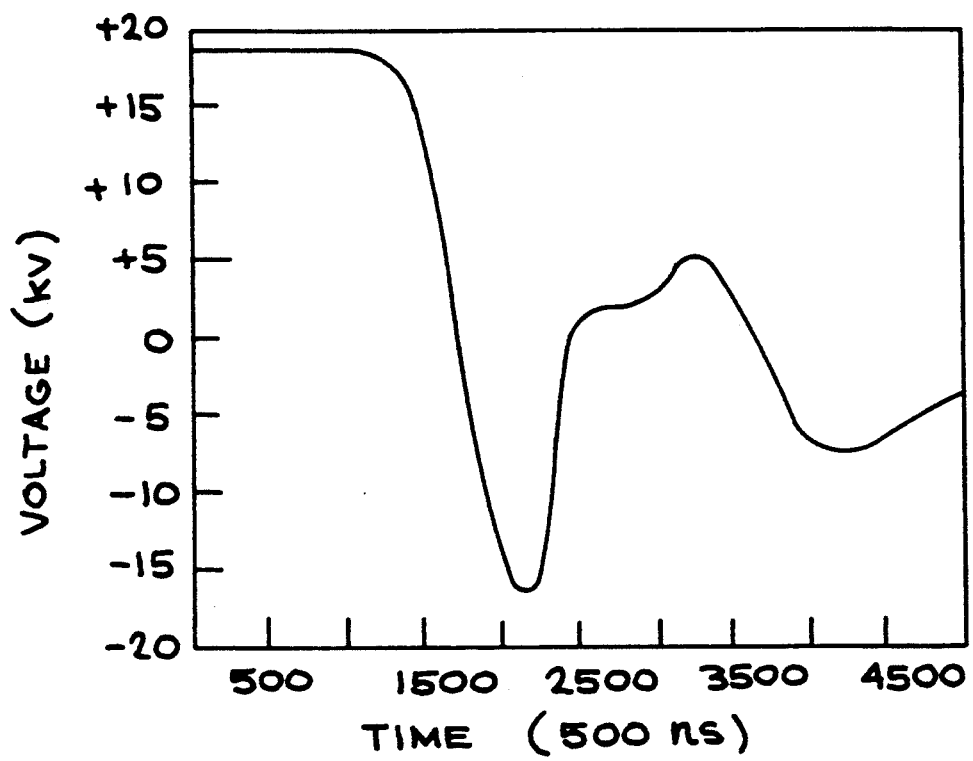
FIG. 5A depicts a timing diagram. The vertical axis represents voltage and the smallest divisions are 1000 volts. The horizontal axis represents time and the smallest divisions are 100 nanoseconds ("nS"). The figure shows the voltage on capacitor $C_0$ of FIG. 1 measured between the magnetic assist and $C_0$.
Figure 5B:
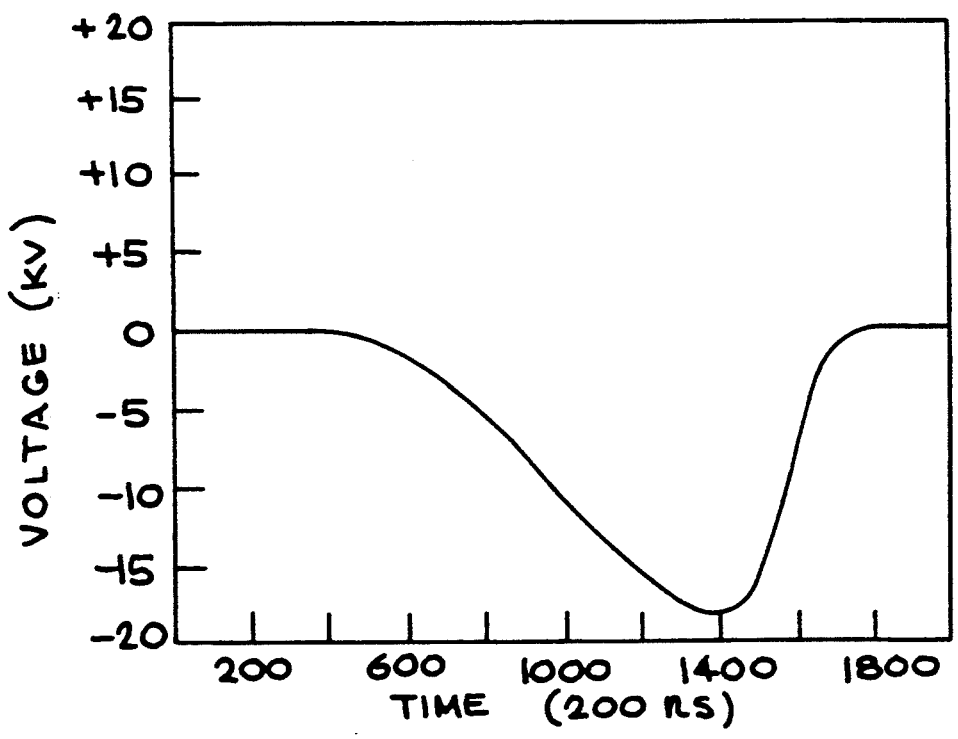
FIG. 5B depicts a timing diagram. The vertical axis represents voltage and the smallest divisions are 1000 volts. The horizontal axis represents time and the smallest divisions are 40 nS. The figure shows the voltage on capacitor $C_1$ of FIG. 1.
Figure 5C:
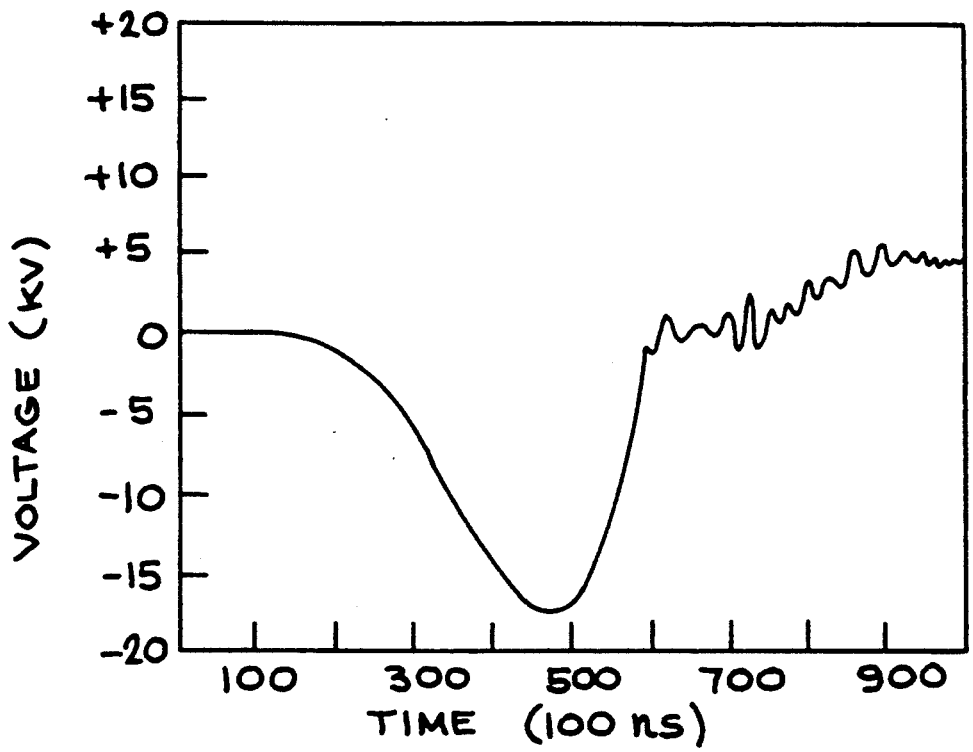
FIG. 5C depicts a timing diagram. The vertical axis represents voltage and the smallest divisions are 1000 volts. The horizontal axis represents time and the smallest divisions are 20 nS. The figure shows the voltage on $C_2$ of FIG. 1.
Figure 5D:
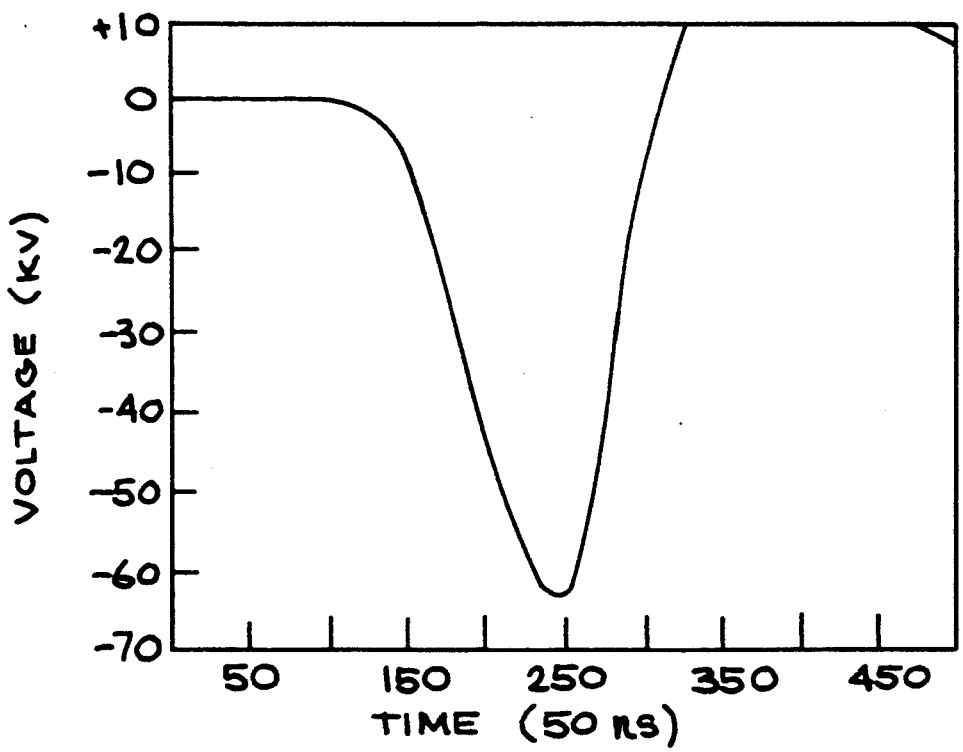
FIG. 5D depicts a timing diagram. The vertical axis represents voltage and the smallest divisions are 2000 volts. The horizontal axis represents time and the smallest divisions are 10 nS. The figure shows the voltage on $C_3$ of FIG. 1.
Figure 6A:
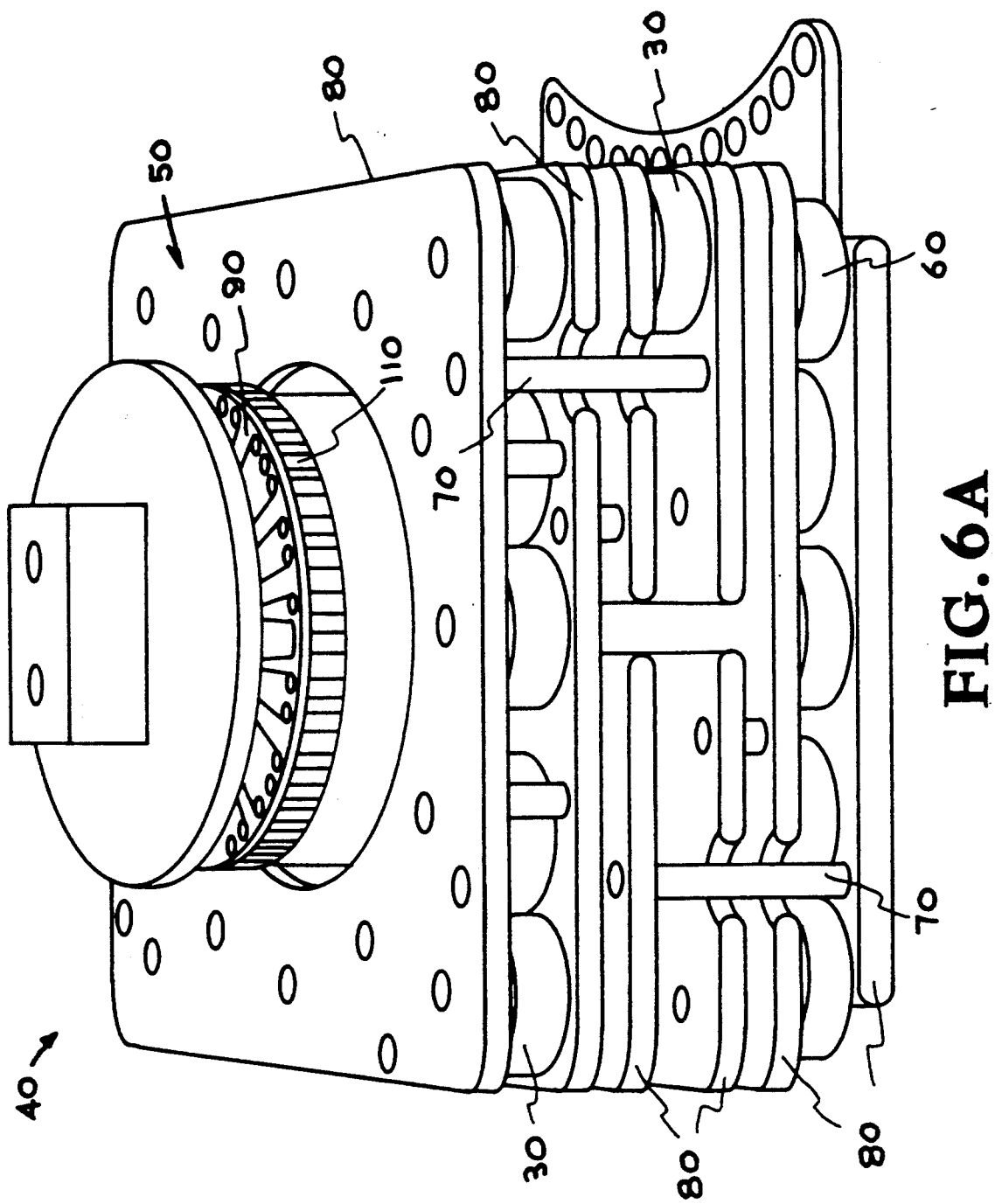
FIG. 6A depicts a perspective view of the first stage assembly.
Figure 6B:
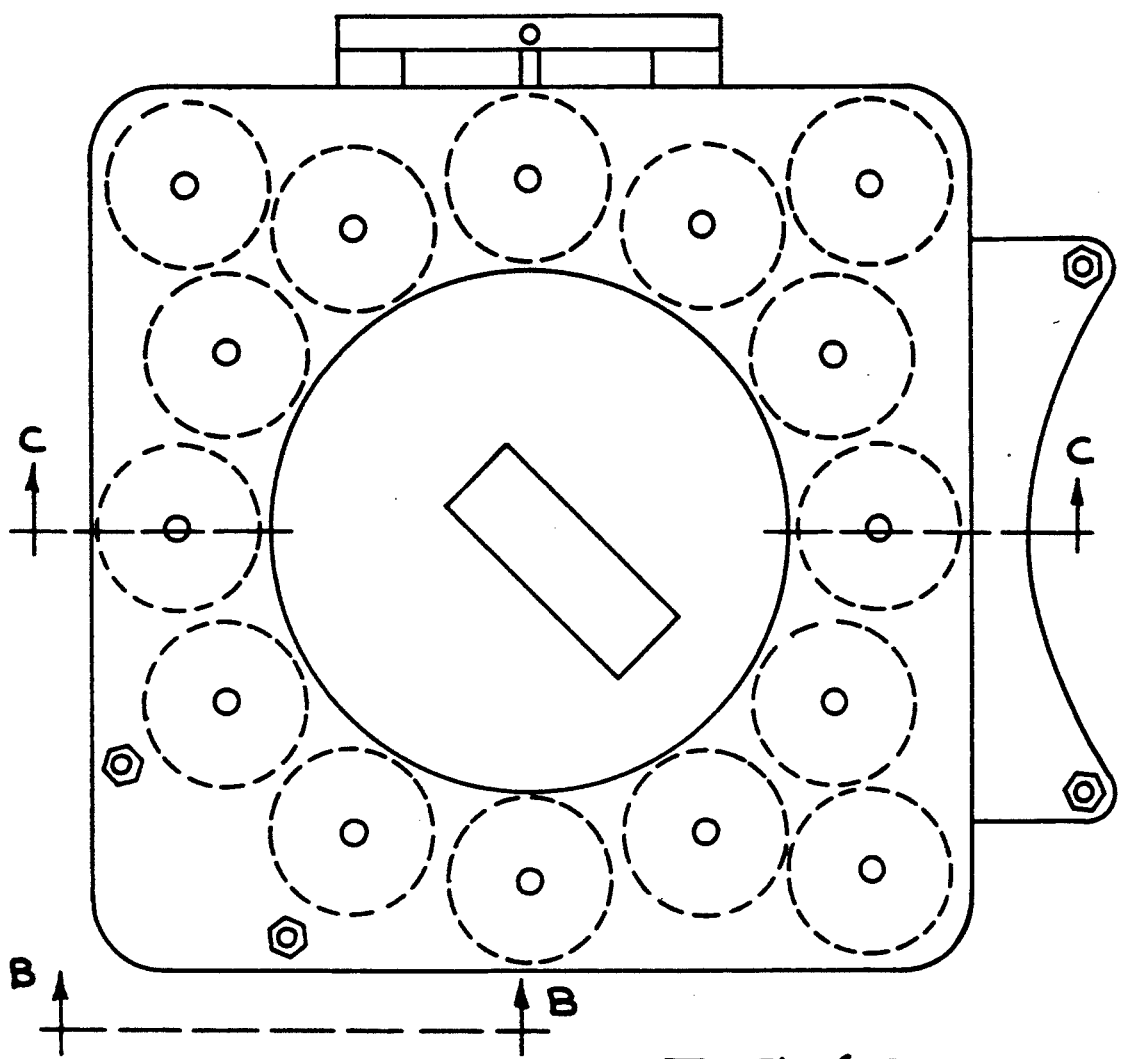
FIG. 6B is a top view of the first stage assembly.
Figure 6C:
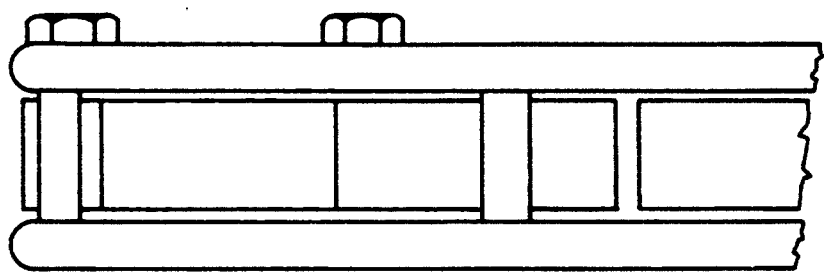
FIG. 6C is a view along line B—B of FIG. 6B of the first stage assembly.
Figure 6D:
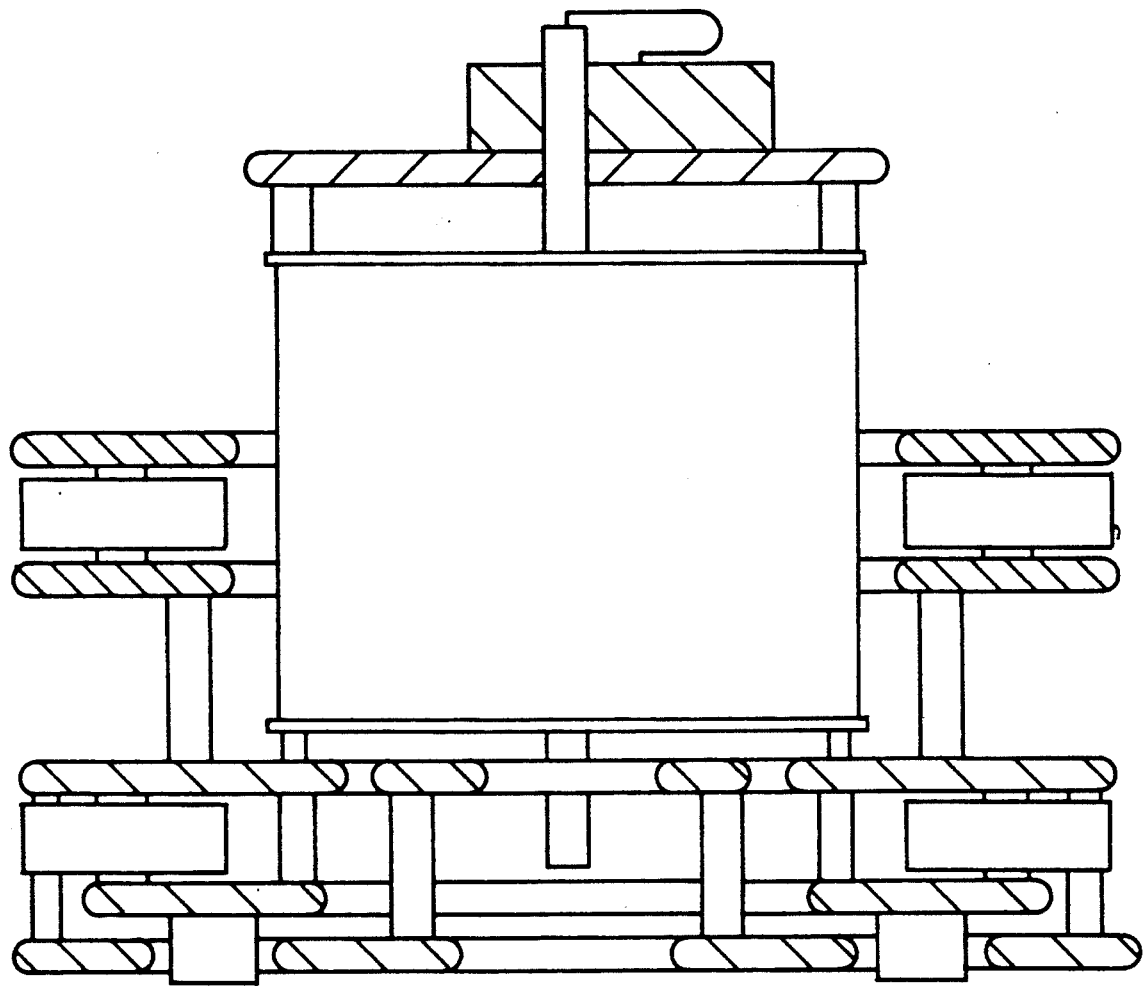
FIG. 6D is a cross-sectional view along line C—C of FIG. 6B of the first stage assembly.
Figure 7A:
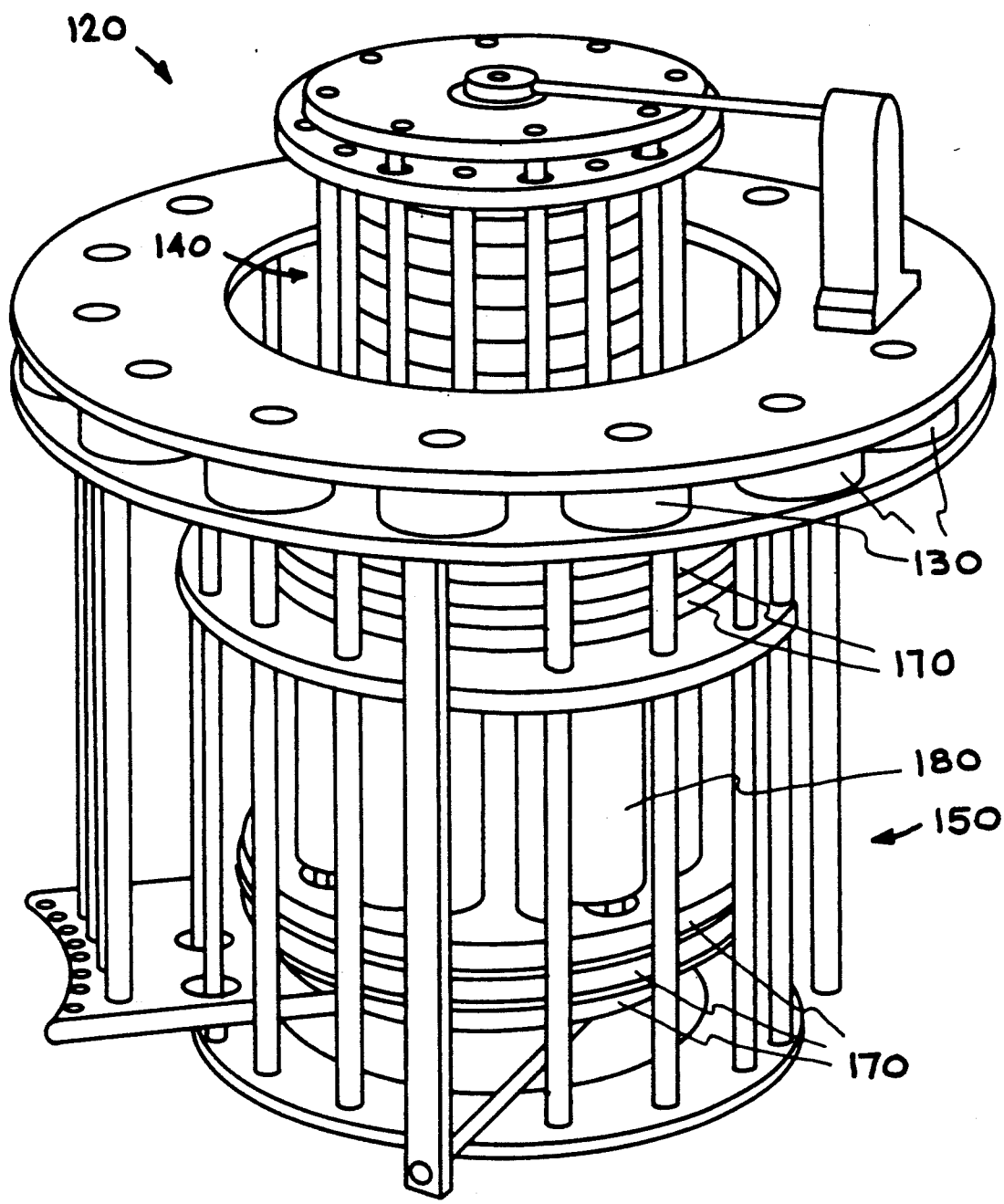
FIG. 7A depicts a perspective view of the second stage assembly including the 1:4 step-up transformer.
Figure 7B:
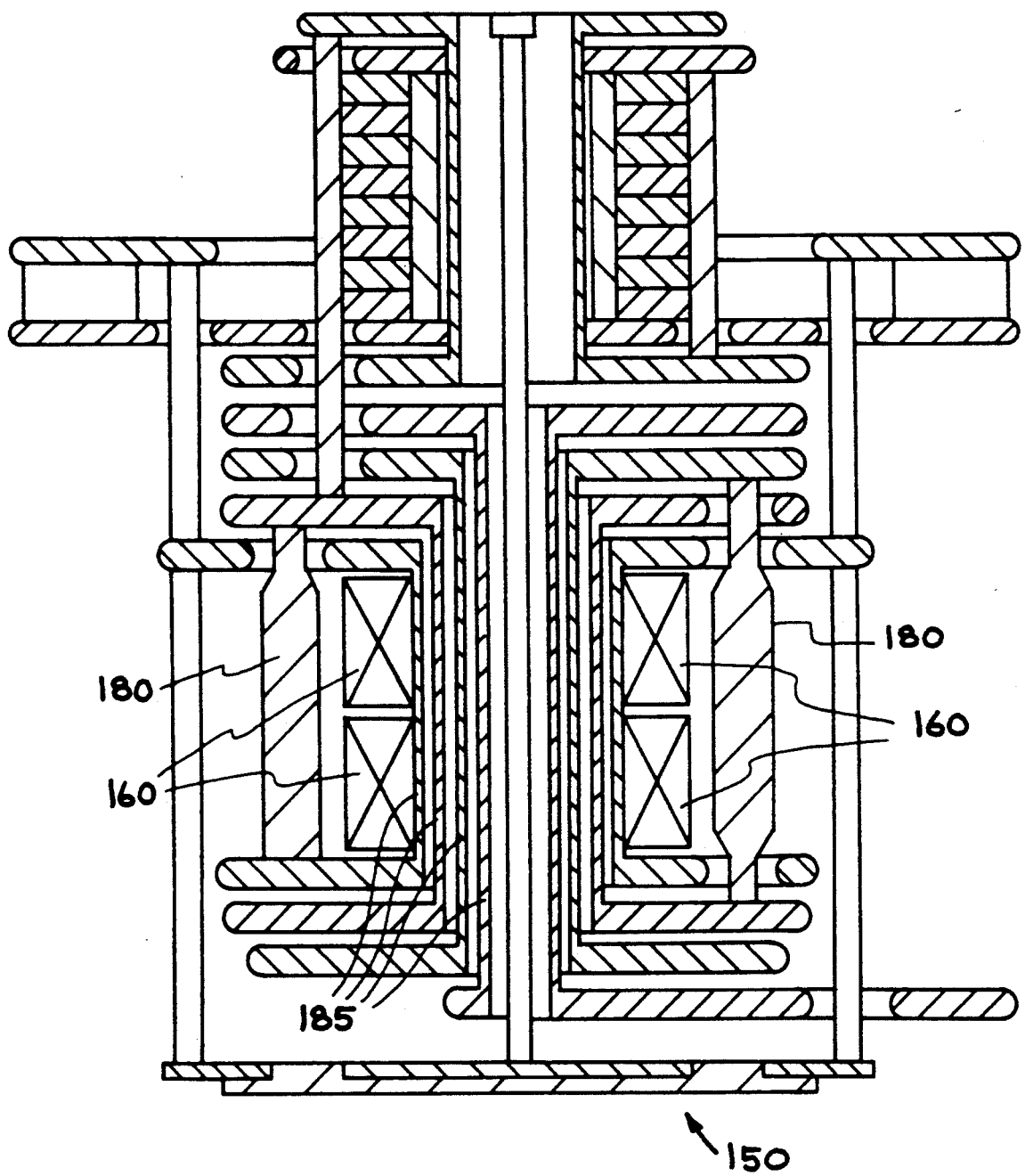
FIG. 7B is a cross-sectional view of the second stage assembly including the 1:4 step-up transformer.
Figure 7C:
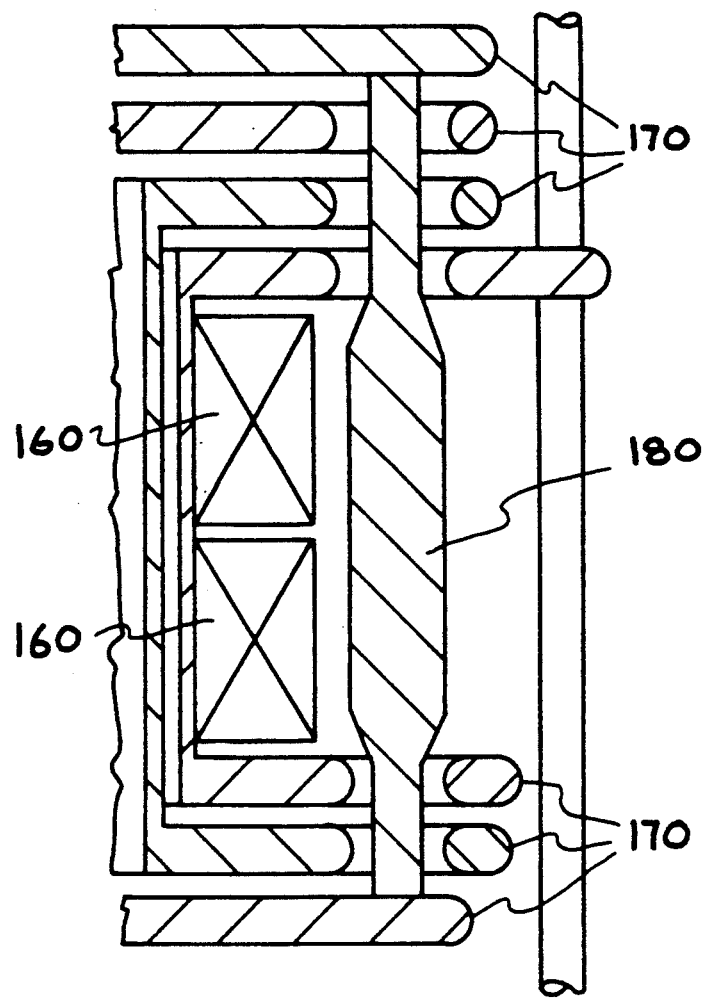
FIG. 7C is a cross-sectional drawing of a portion of the transformer portion of the second stage assembly.
Figure 6E:
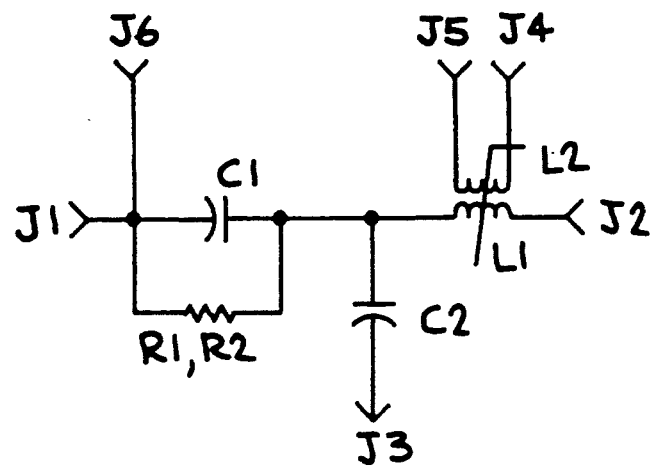
FIG. 6E is an electrical schematic diagram of the first stage assembly.

Capacitor $C_0$ (30) is a strontium titanate ceramic 30 kV capacitor. In a preferred embodiment, it is fabricated of a plurality of disc-shaped capacitor units depicted in FIG. 4, FIG. 6A, and FIG. 6D. The first stage 40 of the magnetic modulator is depicted at FIG. 4. First stage 40 comprises a first stage switch 50 depicted in FIG. 3, capacitors $C_0$ (30) and $C_1$ (60), and aluminum rods and plates (70, 80). FIG. 3 depicts a perspective view of the first stage switch 50 at the left and a bottom-up perspective view of the first stage switch 50 at the right. Printed circuits 90, 100 electrically connect rods 110 at the inner and outer diameter of first stage switch 50 to form windings. Toroidal magnetic cores are enclosed by the rods 110 and printed circuit board 90, 100. These toroidal magnetic cores are fabricated of a series of toroidally shaped pieces of ferrite, each preferably physically separated from the adjacent ferrite toroid by a small gap so as to permit coolant (non-conductive) to pass between adjacent toroids. Capacitors $C_1$ (60) are also 30 kV strontium titanate ceramic capacitors. The second stage 120 of the magnetic modulator comprises capacitor $C_2$ (130) which is comprised of a series of 30 kV strontium titanate disc capacitors, a second stage switch 140 and a 1:4 step-up auto transformer 150. Transformer 150 comprises toroids fabricated of amorphous tape (insulated) 160 and windings or turns comprising plates 170 and rods 180 and concentric tubes 185.

Figure 8A:
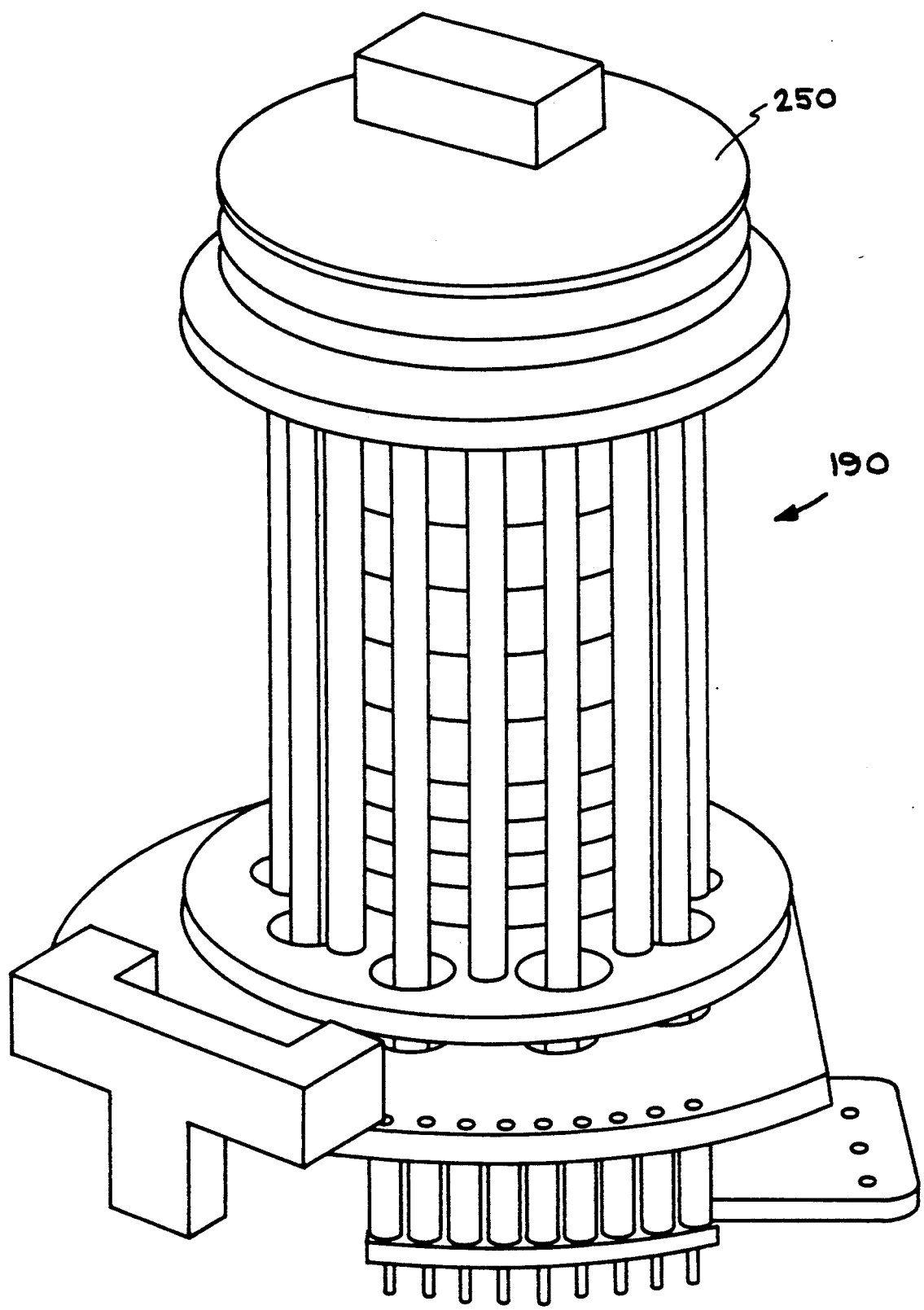
FIG. 8A depicts a perspective view of the third stage assembly.
Figure 8B:
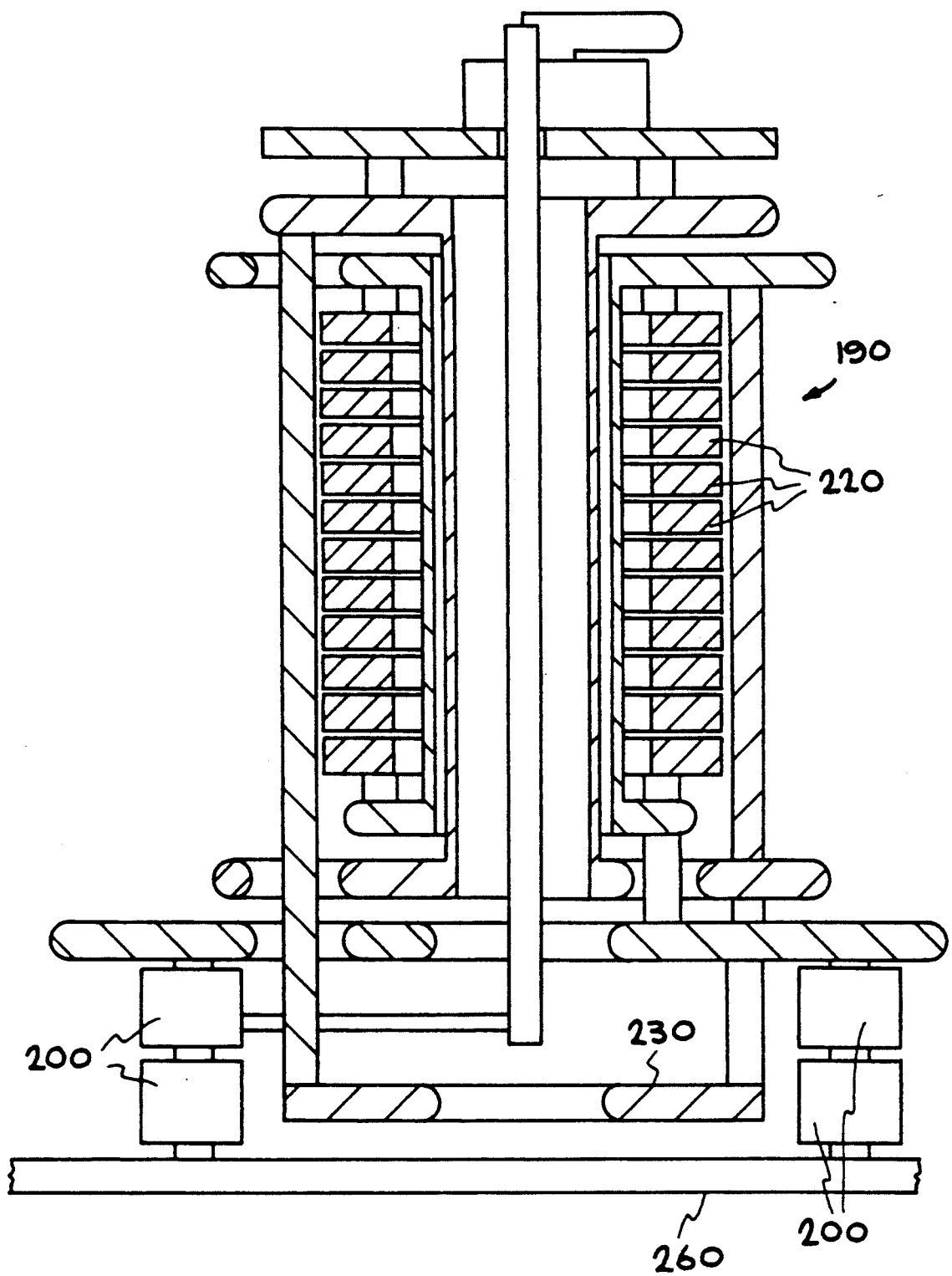
FIG. 8B depicts a cross-sectional view of the third stage assembly.

The third stage 190 comprises capacitors $C_3$ (200) which are 50 kV strontium titanate disc capacitors arranged in series/parallel combination (200) and a third stage switch 210 comprising a number of toroidal elements 220 of magnetic ferrite material. The third stage switch has two output turns or windings as depicted in FIG. 8B and outputs the electrical pulses for application to the laser across terminals 230 and ground (260). Third stage switch 190 is capped with a Delrin ™ high voltage insulator 250 which supports the reset bias circuit.

$C_{pk}$ (215) shown in FIG. 1 is a "peaking capacitor" which is placed in parallel with the load (preferably a copper vapor laser) (not shown). When $C_3$ (200) becomes fully charged and third stage switch 210 becomes fully saturated, voltage is applied to the laser and $C_{pk}$ (215).

In a preferred embodiment of the present invention $C_{pk}$ comprises a plurality of series combined 50 kv strontium titanate ceramic disc-type capacitors with a 100 kV hold off value combined in parallel.

FIG. 4 depicts the magnetic modulator assembly laid out as it would be in use on grounded aluminum base plate 260.

Introduction to Terminology

A listing of the terms used herein is set forth in Table 1 below:

TABLE 1

Definition of terms

| Term | Definition | Units |
|---|---|---|
| $Vol_n$ | minimum magnetic core volume of $L_n$ | meters$^3$ (m$^3$) |
| $A_n$ | magnetic cross-sectional area of $L_n$ | meters$^2$ (m$^2$) |
| OD | outer diameter of magnetic core (toroid) | meters (m) |
| ID | inner diameter of magnetic core (toroid) | meters |
| $\Delta B_s$ | usable change in core flux density | tesla |
| $N_n$ | number of turns on the $L_n$ winding | |
| $w_n$ | axial length of $L_n$ winding | meters |
| pf | packing factor - cross-section area of magnetic material divided by total area enclosed by windings | |
| $L_n$ | the n$^{th}$ stage of magnetic compression | |
| $L_n^{sat}$ | saturated inductance of $L_n$ | henries |
| Gain$_n$ | ratio of charge to discharge time for $L_n$ | |
| $C_n$ | capacitance at the input of $L_n$ | farads |
| $E_{cn}$ | per pulse energy stored on $C_n$ | joules |
| $<V_{C_n}>$ | average charge voltage on capacitor $C_n$ | volts |
| $\tau_{C_n}^{chg}$ | time required for capacitor $C_n$ to charge to peak voltage | seconds |
| $\tau_{L_n}^{sat}$ | hold-off time - time required to saturate $L_n$ at a given average charge voltage | seconds |
| $\tau_{prop}$ | total propagation delay through the modulator - equal to the sum of the hold-off times of all the stages | seconds |
| $\mu_o$ | free space permeability = $4\pi*10^{-7}$ | henries/m |
| $\mu_r$ | relative permeability | |
| $\mu_r^{sat}$ | saturated value of relative permeability | |
| $\Delta t$ | time jitter | seconds |
| $\Delta v$ | pulse-to-pulse variations in peak charge voltage | volts |
| MTBF | mean time between failures | |
| MTBR | mean time between replacements | |
| nS | nanoseconds | $10^{-9}$ seconds |
| $\mu$S | microseconds | $10^{-6}$ seconds |

Electrical and Mechanical Requirements

As with any application of an invention, there are system requirements, specifications, limitations, and goals that must be satisfied by the resulting product design and performance. The specific modulator electrical requirements for any application of the present invention are derived from the desired operational parameters for the laser and the main switch. Physical restrictions are imposed by the system packaging of the laser, modulator, power supplies, trigger systems, control systems, etc. establish size and weight constraints. The goals for component lifetimes and the package MTBF determine the scope of repair and testing facilities and are cost driven. The major electrical and mechanical parameters of the preferred embodiment are listed Table 2.

TABLE 2

Specifications and Requirements

| Design Specifications | Performance Characteristics |
|---|---|
| Laser Requirements: | >60 kV peak voltage at laser head |
| | ≦40 ns voltage risetime (10%-90%) |
| | 5-6 joules/pulse delivered to laser |
| | Continuous operation ≈4.5 kHz. |
| Other Specifications: | MTBF ≧ 1000 hours |
| | Time jitter < +2 ns on output pulse |
| | 1 $\mu$s minimum thyratron conduction time |
| | 20 kV maximum thyratron voltage |
| Mechanical Specifications: | Modulator enclosure ≈2' × 2' × 6' |
| | Cooling by immersion in dielectric |

TABLE 2-continued

Specifications and Requirements

| Design Specifications | Performance Characteristics |
|---|---|
| | coolant with internally mounted liquid to liquid heat exchanger |

Modulator Topology

The overall gain required for the presently preferred modulator design is determined by the ratio of the thyratron conduction time (which is also the hold-off time of the first magnetic switch) to the output pulse risetime. These parameters taken from Table 2 give a minimum gain of 25 (1 $\mu$s/40 ns). Either three stages of compression each having a gain of approximately three or two stages of compression each with a gain of five may be employed to accomplish this. Because core losses scale with the gain squared (see the discussion below under "Modulation Design"), a modulator designed for two stages with gains of five will have approximately 85% more core losses than the same modulator using compression gains of three, although some of these losses will be offset by the reduction in capacitor and conduction losses associated with one less stage of compression. A topology consisting of three stages was selected as the preferred embodiment.

To satisfy the selected output voltage design requirement a transformer is included. The circuit location of this transformer is sometimes determined by the switch design in that the circuit impedances can lead to physically impractical mechanical structures (windings having less than one turn or an excessively large number of turns). To operate the modulator components at the lowest voltage possible and to minimize the core material needed for the transformer the transformer was placed between the second and third stage. This circuit topology is shown schematically in FIG. 1.

Modulator Design

Derivations of the theory of magnetic compression circuit operation and magnetic switch design have been extensively covered in various references and are not repeated here. However, certain relationships are important for a full understanding of the circuit topology of this invention, and some definition of the terminology used is believed in order. Table 1 lists the terms and definitions for the toroidal based design criteria incorporated in the present invention.

One fundamental relationship, Eq. (1), defines the minimum required volume of magnetic material as a function of circuit parameters ($E_{Cn}$), switch parameters (gain and packing factor), and material parameters ($\Delta B_s$ and $\mu_r^{sat}$).

$$Vol_n \approx Gain_n^2 * E_{Cn} * \pi^2 * \mu_r^{sat} * \mu_0 / (4*(\Delta B_s * pf)^2) \quad (1)$$

Eq. (1) shows that core losses, which are directly proportional to the core volume, are a strong function of switch gain. Multiple switches were therefore chosen as being preferable to a single stage of compression having high gain. Core losses alone were not used to determine system design as other loss mechanisms such as resistive losses in conductors and dielectric losses in capacitors are a significant portion of total circuit losses.

The packing factor (pf) also significantly affects core volume requiring careful consideration of the magnetic fields surrounding the magnetic core. The windings must therefore be tightly coupled to the core regardless of the choice of core material.

Magnetic Material Selection

Reasonable values for gain range between 3 and 10 depending on the choice of magnetic material. Switch designs with a compression gain near the lower limit of this range usually utilize ferrite materials and designs at the upper limits usually utilize metal tapes and, in particular, the amorphous metal tapes. Gain, however, was only one consideration in selecting a core material. Specific cooling requirements, size and weight limitations, mechanical packaging (particularly at high voltage), and the required efficiency are taken into account for the material choice.

The NiZn class of ferrites was the preferred material chosen for the specific application described herein for several reasons. These ferrites have a dc volume resistivity of $10^6-10^{10}$ ohm-cm which allows the turns of the windings to be in direct contact with the ferrite thereby maintaining a high packing factor and also simplifying the mechanical packaging. Although the available $\Delta B$ is relatively low (0.5–0.75 tesla) and a larger volume of material is required, this also gives more surface area for cooling, providing for long life at 4.5 kHz and submicrosecond saturation times.

It should be noted that there are no fundamental limitations which prevent amorphous materials or other metal tapes from being used in this application, but their use requires stringent attention to packaging and cooling.

General Switch Design

Figure 2:
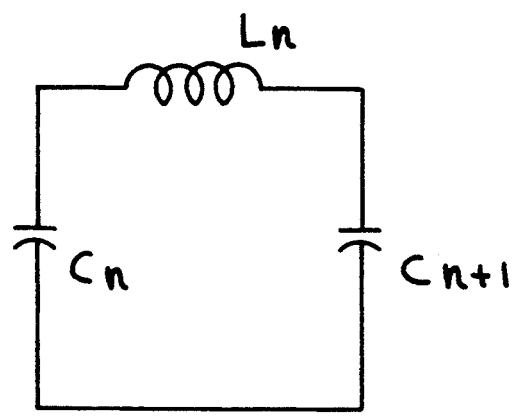
FIG. 2 depicts a simplified electrical schematic diagram of a single stage of a magnetic compression circuit.

A magnetic switch is comprised of two basic parts: the electrical design and the mechanical design. The electrical design for the circuit shown in FIG. 2 determines the value of the capacitors and the value of the saturated inductor for a specific post-saturation energy transfer time.

For an energy transfer time ($\tau_{C_{n+1}}^{chg}$), peak operating voltage ($V_{C_n}^{pk}$), and stored energy ($E_{C_n}$) the equations are:

$$C_n = 2E_{C_n}/V_{pk}^2 \qquad (2)$$

$$\tau_{C_{n+1}}^{chg} = \pi\sqrt{(L_n^{sat} C_{eq})} \qquad (3)$$

Where $C_{eq}$ is the equivalent series value of $C_n$ and $C_{n+1}$ (usually $C_n = C_{n+1}$). Once these values are determined, other circuit parameters such as peak and rms currents are calculated and used to determine ohmic losses in capacitors and windings.

The mechanical design is much more detailed. Information on the properties and geometry of the magnetic material and windings were considered in order to achieve the required gain while also satisfying the values determined in the electrical design. The mechanical design also meets the requirements imposed for cooling and operation at high voltage. An iterative process was employed with many variables and was implemented in a computer spreadsheet.

For toroidal core geometries, the equations used in the mechanical design are:

$$Vol_n \approx Gain_n^2 \cdot E_{C_n} \cdot \pi^2 \cdot \mu_r^{sat} \mu_0 /(4 \cdot (\Delta B_s \cdot pf)^2) \qquad (4)$$

$$L_n^{sat} = \mu_r^{sat} \mu_0 \cdot w_n \cdot N_n^2 \cdot \ln(OD/ID)/(2\pi) \qquad (5)$$

$$<V_{C_n}> \cdot \tau_{L_n^{sat}} = N_n \cdot A_n \cdot \Delta B_s \qquad (6)$$

To ensure operational performance, it was determined that the discharge time of a given stage should be equal to or less than the hold-off time of the next stage with this relationship held for every compression stage in the modulator. Achieving this overlap of saturation and hold-off times of adjacent switches required several iterations of the mechanical design for the entire modulator. Only the final iteration is presented herein.

First Stage Design

The peak input charge voltage on $C_0$ was selected to be 20 kV ($\approx 8$ joules). After including losses due to the thyratron inversion circuit, the peak charge voltage on $C_1$ is approximately 19 kV. With a gain of $\approx 3$, a 1 μs thyratron conduction time, and input energy at 7.2 joules per pulse (determined from previous iterations), the electrical design for this example for the first stage gives the value for $C_1 = 40$ nF, $C_{eq} \approx 20$ nF, $\tau_{C_2}^{chg} \approx 330$ ns, and $L_1^{sat} \approx 550$ nH.

For the mechanical design, a ferrite toroid was chosen with a $\Delta B_s \approx 0.6$ T (assuming a dc reset current) and the nominal dimensions 101.6 mm ID, 152.4 mm OD, and 12.7 mm thick. The packing factor, 0.9, includes small gaps between individual toroids for cooling and is calculated as the total magnetic cross-section area divided by the total area encompassed by the turns of the winding. Several ferrites meet the design needs: CMD 5005 from Ceramic Magnetics, PE-11B from TDK, and C-7D from Stackpole (no longer a producer of ferrites).

Magnetic materials do not reach saturated permeabilities of unity until the H field is several tens of thousands of ampere-turns per meter, therefore an average value over the entire energy transfer time (determined experimentally to be approximately 1.9–2.0) was selected. Substituting these numbers into Eq. (4) gives $Vol_1 \approx 1.3 \cdot 10^{-3}$ m$^3$. This volume requires a stack of 10 toroidal cores thereby giving a combined area cross section of $3.23 \cdot 10^{-3}$ m$^2$. From Eq. (6), 5 turns (rounded up from 4.9) are required.

Mechanically, the turns on the switch are constructed of 0.375 inch diameter aluminum rods positioned on and touching the inside and outside diameters of the ferrite toroids. At the ends of the toroidal stack, the rods are fastened with screws to a printed circuit board which has wide (low inductance) traces which connect the outside rods to the appropriate inside rods thereby completing the circuit around the core. It is important to enclose the ferrite core as completely as possible to minimize leakage inductance, therefore four parallel sets of turns are used. To further enclose the core, two rods, electrically in parallel, are used for the outside turns. The printed circuit boards not only complete the electrical connections for the turns in a low profile (i.e., high pf) low inductance manner, they also serve to maintain the proper relative position of the rods. The overall result is a rigid, self-supporting mechanical structure with clearly defined and controlled inductances. This switch is shown in FIG. 3. With the rods touching the ferrite, this winding geometry has an 101.6 mm ID, 152.4 mm OD, and 140 mm overall length. Based upon the foregoing, the saturated inductance of $L_1^{sat} = 566$ nH is determined from Eq. (4). This value meets the requirements of the electrical design to within a few percent.

A discussion of the first stage would not be complete without an examination of the remainder of the circuit. The total loop inductance (excluding the switch) must be kept small. Thus low inductance capacitors and compact interconnection circuits (wide parallel plates, rods, tubes, etc.) were used. Strontium titanate ceramic capacitors from TDK and Murata Erie satisfy the requirements for low inductance and, in addition, exhibit the required reliability. Fifteen of these 2.7 nF, 30 kV capacitors are mounted between parallel plates to get a total of 40.5 nF to form the $C_0$ and $C_1$ capacitors.

Second and Third Stage Design

The description of the design for the other stages is basically a repetition of the first stage design with appropriate consideration for losses in earlier stages, different time scales, and circuit parameters modified by reflected impedances due to the transformer. Data for frequency dependent ferrite losses are not readily available from vendors, so empirically developed values were used. The $I^2R$ losses were determined by measuring or calculating, for the appropriate frequencies, the winding resistance and capacitor equivalent series resistance and multiplying by the rms current as determined from the loop equations. It is important to allocate the losses appropriately. For example, all the first stage core losses will occur just prior to saturation or when the input voltage on $C_1$ is at its peak, but the transfer losses (due to winding and capacitor losses) occur after saturation and will reduce the input energy to the second stage. A summary of the input and calculated values for all three stages is presented in Table 3.

Mechanical construction of the second and third stages is different from that of the first stage in that aluminum plates replace the printed circuit boards and concentric tubes replace the rods at the ID (inner diameter). This unique rod and plate style of construction is particularly useful for high voltage 2 or 3 turn switches. The complete modulator apparatus is shown in FIG. 4.

TABLE 3

Input and calculated values for the modulator design.

| Design Parameter | 1st Stage | 2nd Stage | 3rd Stage |
|---|---|---|---|
| Peak Charge Voltage | 19 kV* | 18.5 kV | 67 kV |
| Peak Input Energy (joules) | 7.22 | 6.83 | 5.68*** |
| Input Capacitance | 40 nF | 40 nF | 2.5 nF |
| Output Capacitance | 40 nF | 40 nF** | 2.0 nF |
| Calculated Hold-Off Time | 992 ns | 324 ns | 114 ns |
| Calculated Transfer Time | 334 ns | 112 ns | 31 ns |
| Calculated Gain | 3.05 | 3.0 | 3.65**** |
| RMS current at 4.5 kHz | 98 A | 164 A | 60.6 A |
| Calc. Saturated Inductance | 566 nH | 63 nH | 89 nH |
| Core Parameters | | | |
| $\Delta B_S$ | 0.6 Tesla | 0.6 Tesla | 0.6 Tesla |
| I.D. | 101.6 mm | 101.6 mm | 101.6 mm |
| O.D. | 152.4 mm | 152.4 mm | 152.4 mm |
| Height | 127 mm | 102 mm | 127 mm |
| Volume (m$^3$) | 1.29 E-3 | 1.03 E-3 | 1.29 E-3 |
| Winding Parameters | | | |
| Number of Turns | 5 | 2 | 2 |
| I.D. | 101.6 mm | 101.6 mm | 101.6 mm |
| O.D. | 152.4 mm | 152.4 mm | 152.4 mm |
| Height | 140 mm | 108 mm | 137 mm |
| Core Losses | | | |
| Core Dissipation (joules/m$^3$) | 200 | 300 | 400 |
| Core Loss (joules/pulse) | 0.26 | 0.31 | 0.52 |
| Transfer Losses | | | |
| Winding Loss (joules/pulse) | 0.01 | 0.01 | 0.002 |
| Capacitor Loss (joules/pulse) | 0.08 | 0.22 | 0.34 |

*after inversion circuit losses
**2.5 nF reflected to transformer primary
***includes 0.3 joule/pulse loss in the transformer
****gain is larger due to small value of peaking capacitor Step-up Transformer In the preferred embodiment the transformer is configured as an auto transformer with a 1:4 step-up ratio. The core material is 18 cm$^3$ of unannealed (as cast) Allied 2605 S3A Metglass ™ insulated with 0.3 mil Kapton ™ plastic film. To keep losses and internal heat dissipation low, the total flux swing is less than 25% of the available voltseconds. The core is reset with a dc reset circuit which is described later. The previously described rod and plate construction is also used for the transformer.

Main Switch

The preferred embodiment magnetic modulator apparatus of the present invention includes a triggered closing switch. The preferred switch parameters are given in Table 4. The initial layout preferably uses a single thyratron for this switch and a magnetic assist is inserted between the thyratron and capacitor $C_0$ to reduce the anode dissipation. In operation, the thyratron voltage falls upon being triggered, but the current is delayed by the magnetic assist, thereby reducing the turn-on losses. Concurrently, plasma spreads within the thyratron allowing for more effective use of the entire cathode and increases useful operational lifetime. The magnetic assist provides approximately 200 nS of hold-off at full voltage.

The laser presents a very inductive, non-linear load to the modulator. It is not possible to efficiently couple energy into the laser while simultaneously achieving maximum light output. As a result of this coupling inefficiency substantial energy is reflected from the load towards the modulator input causing the main switch to conduct a second current pulse. The amplitude of the second pulse varies with the selected load parameters, but is approximately one-third of the initial pulse and has essentially the same pulse width. The time interval between the two current pulses is approximately 1 $\mu$s at full operating input voltage. The second conduction stores the reflected energy on $C_0$ where this energy is dissipated before the next charge pulse. A diode clipper circuit placed across $C_0$ (not shown) dissipates the energy.

TABLE 4

| Triggered switch requirements | |
|---|---|
| Jitter | <1 ns |
| Lifetime | >5000 MTBR |
| Operating Voltage | 20 kV |
| Recovery Time | <20 $\mu$s |
| Conduction Time | 1 $\mu$s |
| Peak Current (1st Pulse) | ≈1.3 kA |
| Peak Current (2nd Pulse) | ≈.4 kA delayed by ≈1 $\mu$s from the first current pulse |
| Average Current | 4.8 Amperes |

Charge Circuit

The preferable charge circuit for this modulator apparatus is a saturable inductor which resonantly charges $C_0$. This inductor, located between a 6–10 kV regulated dc power supply and the thyratron anode, has approximately 70 $\mu$s of hold-off time which ensures thyratron recovery. Upon saturation, $C_0$ is resonantly charged to approximately 1.8 times the dc supply voltage through a series blocking diode (not shown) in approximately 70 $\mu$s. During the charge cycle, the magnetic assist is reset.

Ancillary Circuits

For proper operation of the modulator the output pulse jitter should be less than two nanoseconds in order to be able to synchronize the light pulses of many lasers. Jitter may be broadly characterized as having two forms: pulse-to-pulse jitter and long term drift. Long term drift is due to heating of components, aging of switches, etc. and is removed with low level circuitry that adjusts the timing pulse which drives the main switch trigger generator.

Pulse-to-pulse jitter in magnetic modulators has two major causes; differences in the initial voltages on capacitors and variations in $\Delta B_s$ on any of the compression stages. Any of several methods for controlling or compensating for these problems can be used and are described below.

Reset and Bias Circuit

After the discharge pulse, each magnetic core is returned to precisely the same point on the BH curve prior to the next pulse. In order to maximize $\Delta B_s$ and minimize the required magnetic volume, the core is reset into negative saturation. The modulator apparatus uses a dc reset circuit consisting of a current source (a voltage supply isolated with a large inductor) which couples to each of the magnetic cores with a single, noncontacting turn through the cores. The voltage induced across the core by the reset circuit drives the core into negative saturation and, once in saturation, the core is biased at this point by the H field generated by the dc current. All the stages are held at their bias points for low jitter to be achieved. Ripple current will cause slight variations in $\Delta B_s$ but, if necessary, these can be reduced by increasing the current amplitude to bias the cores further into saturation.

Jitter Compensation Circuit

By biasing the cores, all the capacitors, with the exception of $C_0$, are fully discharged during the interval between pulses and therefore have the same initial condition at the beginning of the next pulse. This eliminates the effect of voltage variation everywhere except on the input capacitor. Time jitter, $\Delta t$, due to variations in peak charge voltage, $\Delta v$, on $C_0$ scales as shown in Eq. (7).

$$\Delta t = 0.5 * \Delta v * \tau_{prop} \qquad (7)$$

where $*\tau_{prop}$ is the total propagation delay through the modulator. This results in a design with a minimum propagation delay of 1.44 μs (1 μs + 0.33 μs + 0.11 μs) at full operating voltage. If the input power supply has 1% voltage regulation and the resonant charge has a voltage step-up ratio of $\approx 1.8$, the minimum jitter will be an unacceptable 13 ns (0.01*1.8*0.5*1.44 μs). This jitter may be reduced by more precisely regulating the power supply. Since the ultimate objective is to synchronize the output pulses of several modulators, a different and more preferable approach involves real time adjustment of the pulse-to-pulse timing of the main switch trigger to compensate for voltage variations on $C_0$. This is achieved by sensing the $C_0$ charge voltage and either advancing the timing of the trigger pulse if the charge voltage is lower than the reference voltage, or delaying the trigger pulse if the charge voltage is higher than the reference voltage. A detailed explanation of the specific circuit used for this modulator is given in a paper by J. V. Hill and D. G. Ball, et al., "Reliable, High Repetition Rate Thyratron Grid Driver Used With a Magnetic Modulator," *Eighth IEEE International Pulsed Power Conference.* June, 1991.

Performance Data

Modulator performance is determined from voltage measurements taken at different points. These oscillographs, presented in FIGS. 5A-D, verify the calculated values for hold-off and transfer times. Losses also correlate to design with the exception of losses in the inversion circuit which are larger than expected. Overall efficiency, defined as energy delivered to the laser head divided by input energy, is approximately 60%.

Since experimentation began in 1985, approximately 45 experimental modulators of this design have accumulated more than 950,000 hours of testing. As modifications were made resulting in the preferred embodiment, MTBF of the modulator has steadily increased from a few hundred hours to over 2500 hours.

Switch Lifetime

The main switch is the dominating factor which limits MTBF. Thyratrons from ITT, EG&G, and EEV and the Crossatron from Hughes may be used in the modulator. Preferably, a high voltage silicon controlled rectifier (SCR) stack should be used as a direct drop-in replacement for these thyratrons.

Accordingly, we have shown and described an improved magnetic modulator circuit for a metal vapor laser which exhibits long life at high voltages, high average powers, and high repetition rates, while simultaneously meeting stringent requirements for jitter.

The foregoing description of a preferred embodiment of the invention is presented for purposes of illustration and description. It is not intended to be exhaustive or to limit the invention to the precise form disclosed, and obviously many modifications and variations are possible in light of the above teaching. For example, the present invention can be utilized with thyratron or solid state means for generating the first series of electrical pulses. The present invention is a magnetic compression laser driving circuit having applications to metal vapor lasers such as copper vapor lasers, as well as rare gas lasers. Also, the present invention could have applications to any load which requires a high voltage driving pulse.

The present embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A magnetic modulator comprising:
   pulse compression apparatus having as an input a first series of electrical pulses having a first pulse width and a first voltage amplitude and as an output a second series of electrical pulses having a second pulse width and said first voltage amplitude, wherein said first pulse width is of longer duration than said second pulse width,
   a transformer having as an input said second series of electrical pulses having said first voltage amplitude and as an output a third series of electrical pulses having a second voltage amplitude, wherein said second voltage amplitude is greater than said first voltage amplitude,
   said transformer having a step-up ratio of greater than 1:1.

2. The magnetic modulator of claim 1 wherein said transformer has a step-up ratio of greater than 1:2.

3. The magnetic modulator of claim 1 wherein said transformer has a step-up ratio of greater than 1:3.

4. The magnetic modulator of claim 1 wherein said transformer is an auto transformer.

5. A copper vapor laser system comprising:

pulse generation apparatus for generating a first series of electrical pulses having a first pulse width and a first voltage amplitude,
a magnetic modulator including:
a plurality of magnetic switches,
each of said magnetic switches comprising at least one capacitor and at least one inductor;
said magnetic switches configured so as to have as an input said first series of electrical pulses and to form as an output a series of electrical pulses having a second pulse width, said second pulse width being of shorter duration than said first pulse width,
a transformer fabricated from electrically conductive plates and rods arranged in close proximity to a magnetic core, said transformer having a step-up ratio of greater than 1:1.

6. A copper vapor laser system comprising:
pulse generation apparatus for generating a first series of electrical pulses having a first pulse width and a first voltage amplitude,
a magnetic modulator including:
a plurality of magnetic switches,
each of said magnetic switches comprising at least one capacitor and at least one inductor;
said magnetic switches configured so as to form a series of electrical pulses having a second pulse width, said second pulse width being of shorter duration than said first pulse width,
a transformer fabricated from metallic plates and metallic rods arranged in close proximity to a magnetic core, said transformer having a step-up ratio of greater than 1:2.

7. A copper vapor laser system comprising:
pulse generation apparatus for generating a first series of electrical pulses having a first pulse width and a first voltage amplitude,
a magnetic modulator including:
a plurality of magnetic switches,
each of said magnetic switches comprising at least one capacitor and at least one inductor;
said magnetic switches configured so as to form a series of electrical pulses having a second pulse width, said second pulse width being of shorter duration than said first pulse width,
a transformer fabricated from metallic plates and metallic rods arranged in close proximity to a magnetic core, said transformer having a step-up ratio of greater than 1:3.

8. A multistage magnetic modulator comprising:
a plurality of pulse compression stages and at least one transformer stage,
said plurality of pulse compression stages each including at least one capacitor and at least one inductor and adapted to reduce the pulse width of electrical pulses applied to the multistage magnetic modulator,
said transformer stage electrically coupled to said plurality of pulse compression stages and including a step-up transformer having a step-up ratio greater than 1:1 and adapted to increase the voltage amplitude of electrical pulses applied to the multistage magnetic modulator.

9. The multistage magnetic modulator of claim 8 wherein said transformer comprises a toroidal magnetic core.

10. The multistage magnetic modulator of claim 9 wherein said transformer further comprises windings constructed of electrically conductive concentric tubes, electrically conductive rods, and electrically conductive plate-shaped elements.

11. The multistage magnetic modulator of claim 10 wherein said toroidal magnetic core is fabricated from an amorphous tape material.

12. The multistage magnetic modulator of claim 11 wherein said amorphous tape material is Allied 2605 S3A Metglass TM.

13. The multistage magnetic modulator of claim 8 wherein said inductors comprise toroidal magnetic cores.

14. The multistage magnetic modulator of claim 13 wherein said toroidal magnetic cores are fabricated from ferrite material.

15. The multistage magnetic modulator of claim 14 wherein said ferrite material is a member of the NiZn class of ferrites.

16. The multistage magnetic modulator of claim 15 wherein each said inductor comprises a plurality of toroidal magnetic cores, none of which are in mutual contact.

17. A magnetic modulator comprising:
a first stage, a second stage and a third stage,
each of said first, second and third stages including:
an inductor formed from a plurality of toroidal magnetic cores and a plurality of electrically conductive windings oriented about said magnetic cores, and
at least one capacitor in electrical contact with said inductor.

18. The magnetic modulator of claim 17 wherein one of said stages additionally comprises a transformer having a step-up ratio greater than 1:1.

19. The magnetic modulator of claim 17 wherein said plurality of toroidal magnetic cores are oriented along a common axis and said electrically conductive windings are fabricated from rod-shaped conductive elements running parallel to said common axis and planar conductive elements oriented orthogonally to said common axis.

20. The magnetic modulator of claim 19 wherein said toroidal magnetic cores consist of ferrite material.

21. The magnetic modulator of claim 20 wherein said ferrite material is a member of the class of NiZn ferrites.

22. The magnetic modulator of claim 17 wherein said first stage additionally includes a triggered closing switch.

23. A magnetic modulator comprising:
a first stage, a second stage and a third stage,
each of said first, second and third stages including:
an inductor formed from a plurality of first toroidal magnetic cores fabricated of NiZn ferrite and oriented along a common axis, and a plurality of electrically conductive windings oriented about said magnetic cores, said windings comprising rod-shaped conductive elements running parallel to said common axis and planar conductive elements oriented orthogonally to said common axis;
a plurality of capacitors in electrical contact with said inductor, said capacitors fabricated of strontium titanate ceramic;
said second stage additionally comprising a transformer having a step-up ratio in excess of 1:1, said transformer comprising a second toroidal magnetic core fabricated of an amorphous tape material and electrically conductive windings consisting of rod-shaped conductive elements running parallel to the axis of said second toroidal magnetic core and planar conductive elements oriented orthogonally to said axis of said second toroidal magnetic core,
said first stage additionally comprising a triggered closing switch having a magnetic assist.

* * * * *